(12) United States Patent
Lim et al.

(10) Patent No.: US 12,128,450 B2
(45) Date of Patent: Oct. 29, 2024

(54) BACK NOZZLE UNIT AND APPARATUS FOR PROCESSING A SUBSTRATE INCLUDING BACK NOZZLE UNIT

(71) Applicant: SEMES CO., LTD., Cheonan-si (KR)

(72) Inventors: Junhyun Lim, Seoul (KR); Yunseok Jeon, Cheonan-si (KR); Gilhun Song, Cheonan-si (KR); Junkee Kang, Cheonan-si (KR)

(73) Assignee: SEMES CO., LTD, Cheonan-si (KR)

( * ) Notice: Subject to any disclaimer, the term of this patent is extended or adjusted under 35 U.S.C. 154(b) by 539 days.

(21) Appl. No.: 17/392,389

(22) Filed: Aug. 3, 2021

(65) Prior Publication Data
US 2022/0203408 A1    Jun. 30, 2022

(30) Foreign Application Priority Data

Dec. 30, 2020  (KR) .................. 10-2020-0187302

(51) Int. Cl.
*B08B 3/02* (2006.01)
*F26B 3/04* (2006.01)
(Continued)

(52) U.S. Cl.
CPC .................. *B08B 3/02* (2013.01); *F26B 3/04* (2013.01); *B08B 5/02* (2013.01); *H01L 21/67051* (2013.01)

(58) Field of Classification Search
CPC ..... B08B 3/02; B08B 5/02; F26B 3/04; H01L 21/67051
See application file for complete search history.

(56) References Cited

U.S. PATENT DOCUMENTS 8,696,863 B2   4/2014  Higashijima et al.
10,410,906 B2  9/2019  Wang et al.
(Continued)

FOREIGN PATENT DOCUMENTS

CN   110610894 A     12/2019
EP   2051285 A1  *  4/2009   ....... H01L 21/67028
(Continued)

OTHER PUBLICATIONS

Japanese Notice of Reasons for Refusal (with Machine English Translation) dated Sep. 20, 2022 for Japanese Application No. 2021-134728; 8 Pages.
(Continued)

*Primary Examiner* — Benjamin L Osterhout
(74) *Attorney, Agent, or Firm* — DALY, CROWLEY, MOFFORD & DURKEE, LLP

(57) ABSTRACT

An apparatus for processing a substrate may include a processing module including at least one process chamber performing a desired process on a substrate and an index module transferring the substrate from an outside into the processing module. The at least one process chamber may include a supporting unit on which the substrate is placed and a back nozzle unit disposed under a bottom face of the substrate. The back nozzle unit may include a skirt, at least one back nozzle providing a cleaning solution onto the bottom face of the substrate and a gas nozzle providing a gas onto the bottom face of the substrate. The skirt may include a body and a plurality of first flow paths and a plurality of second flow paths which are formed in the body and provide a gas toward the bottom face of the substrate.

18 Claims, 4 Drawing Sheets

(51) Int. Cl.
　　　*B08B 5/02*　　　　(2006.01)
　　　*H01L 21/67*　　　(2006.01)

(56) References Cited

U.S. PATENT DOCUMENTS

| | | | |
|---|---|---|---|
| 2017/0001223 A1* | 1/2017 | Lee | ............... H01L 21/02052 |
| 2017/0153550 A1 | 6/2017 | Kim | |
| 2018/0182645 A1* | 6/2018 | Nakano | ............ H01L 21/67051 |

FOREIGN PATENT DOCUMENTS

| | | | |
|---|---|---|---|
| JP | H 10-135178 A | 5/1998 | |
| JP | H 11-265868 A | 9/1999 | |
| JP | 2002-177854 A | 6/2002 | |
| JP | 2003/022997 A | 1/2003 | |
| JP | 2003-126756 A | 5/2003 | |
| JP | 2018-093146 A | 6/2018 | |
| KR | 2010-0092376 A | 8/2010 | |
| KR | 10-2016-0147162 A | 12/2016 | |
| KR | 10-2020-0078128 A | 7/2020 | |

OTHER PUBLICATIONS

Korean Office Action (with Machine Translation) dated Sep. 5, 2024 for Korean Application No. 10-2020-0187302; 11 Pages.

* cited by examiner

BACK NOZZLE UNIT AND APPARATUS FOR PROCESSING A SUBSTRATE INCLUDING BACK NOZZLE UNIT

CROSS-REFERENCE TO RELATED APPLICATION

This application claims priority to Korean Patent Application No. 10-2020-0187302 filed on Dec. 30, 2020 in the Korean Intellectual Property Office (KIPO), the contents of which are herein incorporated by reference in its entirety.

BACKGROUND

1. Field

Example embodiments of the invention relate to a back nozzle unit and an apparatus for processing a substrate including a back nozzle unit. More particularly, example embodiments of the invention relate to a back nozzle unit capable of enhancing cleaning effect and drying effect of a substrate, and an apparatus for processing a substrate including the back nozzle unit.

2. Related Technology

An integrated circuit device or a display device can be manufactured using an apparatus for processing a substrate including various process chambers such as a deposition chamber, an etching chamber, a coating chamber, a cleaning chamber, a drying chamber, etc. In processes for manufacturing the integrated circuit device or the display device, various impurities, for example, particles, organic contaminants, or metal impurities can be generated while performing predetermined processes on a substrate. When the impurities remain on the upper surface or the bottom surface of the substrate, defects of the substrate may be caused by such remaining impurities such that the performance and the reliability of the integrated circuit device or the display device manufactured using the substrate may be deteriorated.

In general, the conventional apparatus for processing a substrate can include a back nozzle unit having back nozzles and a gas nozzle for removing the particles remaining on the bottom surface of the substrate through a cleaning process and a drying process. However, the conventional back nozzles and gas nozzle can spray only a cleaning solution and a gas in a direction perpendicular to the bottom surface of the substrate so that the efficiency of the cleaning process performed for cleaning the bottom surface of the substrate using such back nozzles and gas nozzle may be reduced. Additionally, the efficiency of the drying process may be reduced since the conventional gas nozzle can spray only the gas in the direction perpendicular to the bottom surface of the substrate.

SUMMARY

It is one aspect of the invention to provide a back nozzle unit capable of enhancing cleaning effect and drying effect of a substrate.

It is another aspect of the invention to provide a process chamber including a back nozzle unit capable of enhancing cleaning effect and drying effect of a substrate.

It is still another aspect of the invention to provide an apparatus for processing a substrate including a back nozzle unit capable of enhancing cleaning effect and drying effect of a substrate.

According to one aspect of the invention, there is provided a back nozzle unit comprising a skirt, at least one back nozzle and a gas nozzle. The skirt may be disposed under a bottom face of a substrate. The at least one back nozzle may protrude from the skirt and may provide a cleaning solution onto the bottom face of the substrate. The gas supply nozzle may protrude from the skirt and may provide a gas onto the bottom face of the substrate. The skirt may include a body and a plurality of flow paths. The plurality of flow path may be formed in the body and may provide a gas toward the bottom face of the substrate.

In example embodiments, the gas nozzle may provide the gas in a direction substantially perpendicular to the bottom face of the substrate and the plurality of flow paths may provide the gas in a direction substantially parallel to the bottom face of the substrate and in a direction inclined relative to the bottom face of the substrate by a predetermined angle of inclination.

In example embodiments, the gas nozzle and the plurality of flow paths provide the gas toward the bottom face of the substrate while the at least one back nozzle provides the cleaning solution onto the bottom face of the substrate.

In example embodiments, the skirt may include a plurality of first flow paths providing the gas in the direction substantially parallel to the bottom face of the substrate.

In example embodiments, the plurality of first flow paths may be disposed along a perimeter of the skirt by substantially constant intervals.

In example embodiments, each of the plurality of first flow paths may prevent the cleaning solution from flowing into the body.

In example embodiments, each of the plurality of first flow paths may be formed upwardly in the body, may be bent downwardly in the body and then may be extended in a direction substantially parallel to the bottom face of the substrate.

In some example embodiments, the skirt further may include a plurality of second flow paths providing the gas onto the bottom face of the substrate by a predetermined angle of inclination. For example, the predetermined angle of inclination may be greater than about 0 degree and equal to or smaller than about 90 degrees with respect to the direction perpendicular to the bottom face of the substrate.

In some example embodiments, the gas provided from the plurality of first flow paths and the plurality of second flow paths may provide again the cleaning solution flowing along the body toward the bottom face of the substrate.

In some example embodiments, the plurality of second flow paths may be divided from the plurality of first flow paths, respectively, and may be extend upwardly in the body.

In some example embodiments, the skirt may additionally include a plurality of guide members adjacent to the plurality of second flow paths, respectively. The plurality of guide members may guide the gad toward the bottom face of the substrate. For example, each of the plurality of guide members may protrude from the body by an angle of greater than about 0 degree and equal to or smaller than about 90 degrees with respect to the direction perpendicular to the bottom face of the substrate.

According to another aspect of the invention, there is provided a process chamber comprising a supporting unit and a back nozzle unit. A substrate may be placed on the supporting unit and the back nozzle unit may be disposed under a bottom face of the substrate. The back nozzle unit includes a skirt, at least one back nozzle and a gas nozzle. The at least one back nozzle may provide a cleaning solution onto the bottom face of the substrate and the gas nozzle may provide a gas onto the bottom face of the substrate. The skirt may include a body and a plurality of flow paths. The plurality of flow paths may be formed in the body and may provide a gas toward the bottom face of the substrate.

In example embodiments, the gas nozzle may provide the gas in a direction substantially perpendicular to the bottom face of the substrate and the plurality of flow paths may provide the gas in a direction substantially parallel to the bottom face of the substrate and in a direction inclined relative to the bottom face of the substrate by a predetermined angle of inclination.

In example embodiments, the gas nozzle and the plurality of flow paths may provide the gas toward the bottom face of the substrate while the at least one back nozzle provides the cleaning solution onto the bottom face of the substrate.

In some example embodiments, the skirt may include a plurality of first flow paths providing the gas in the direction substantially parallel to the bottom face of the substrate and a plurality of second flow paths providing the gas in the direction inclined relative to the bottom face of the substrate by a predetermined angle of inclination. For example, the predetermined angle of inclination may be greater than about 0 degree and equal to or smaller than about 90 degrees with respect to a direction perpendicular to the bottom face of the substrate.

According to still another aspect of the invention, there is provided an apparatus for processing a substrate comprising a processing module including at least one process chamber performing a desired process on a substrate and an index module transferring the substrate from an outside into the processing module. The at least one process chamber may include a supporting unit on which the substrate is placed and a back nozzle unit disposed under a bottom face of the substrate. The back nozzle unit may include a skirt, at least one back nozzle providing a cleaning solution onto the bottom face of the substrate and a gas nozzle providing a gas onto the bottom face of the substrate. The skirt may include a body and a plurality of first flow paths and a plurality of second flow paths which are formed in the body and provide a gas toward the bottom face of the substrate.

In example embodiments, the plurality of first flow paths may provide the gas in a direction substantially parallel to the bottom face of the substrate and the plurality of second flow paths may provide the gas with an angle of inclination of greater than about 0 degree and equal to or smaller than about 90 degrees relative to the bottom face of the substrate.

According to example embodiments of the invention, the back nozzle unit may include the skirt having the plurality of flow paths capable of providing the gas in a direction substantially parallel to the bottom face of the substrate and in a direction inclined to the substrate by the predetermined angle of inclination. The cleaning liquid may be effectively provided onto the bottom face of the substrate using the back nozzle unit so that the efficiency of cleaning process performed on the substrate may be considerably enhanced. Further, the plurality of flow paths of the skirt may provide the gas toward the bottom face of the substrate along various directions including the direction substantially parallel to the bottom face of the substrate, the direction substantially perpendicular to the bottom face of the substrate and the direction inclined by the predetermined angle of inclination such that the efficiency of drying process executed on the substrate may be significantly enhanced. Therefore, an integrated circuit device including a semiconductor device or a display device including a flat panel display device manufactured using the apparatus for processing a substrate may have improved performance and enhanced reliability.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
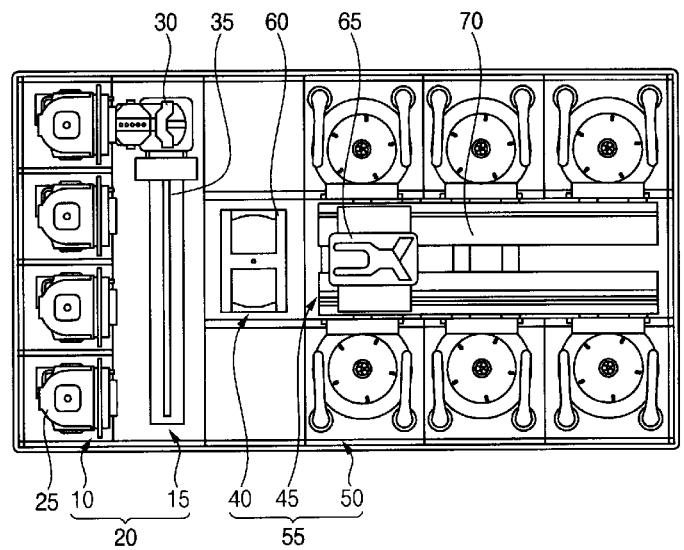
FIG. 1 is a plan view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

FIG. 1 is a plan view illustrating an apparatus for processing a substrate in accordance with example embodiments of the invention.

Referring to FIG. 1, the apparatus for processing a substrate according to example embodiments may include an index module 20 and a processing module 55.

The index module 20 may transfer a substrate into the processing module 55 from an outside and the processing module 55 may perform predetermined processes on the substrate. In this case, the substrate may be used to manufacture an integrated circuit device including a semiconductor device or a display device including a flat panel display device. For example, the substrate may include a silicon wafer, a glass substrate, an organic substrate, a ceramic substrate, etc.

The index module 20 may include a road chamber 10 and a transfer frame 15. A carrier 25 capable of receiving the substrate may be loaded into the road chamber 10. For example, a front opening unified pod (FOUP) may be used as the carrier 25. The carrier 25 may be transferred from the outside into the road chamber 10, and may also be transferred from the road chamber 10 to the outside by an overhead transfer (OHT).

The transfer frame 15 may transfer the substrate between the processing module 55 and the carrier 26 loaded in the road chamber 10. The transfer frame 15 may include an index robot 30 and an index rail 35.

The index robot 30 may move along the index rail 35, and may transfer the substrate between the index module 20 and the processing module 55. For example, the index robot 30 may transfer the substrate between the carrier 25 and a buffer slot 60 while moving on the index rail 35.

As illustrated in FIG. 1, the processing module 55 may perform predetermined processes including, but not limited to, a deposition process, an etching process, a sputtering process, a coating process, a developing process, a cleaning process, and a drying process on the substrate. The processing module 55 may include a buffer chamber 40, a transfer chamber 45, the process chamber 50, a control unit (not shown), etc.

The substrate transferred between the index module 20 and the processing module 55 may stands by in the buffer chamber 40 for the predetermined processes. The buffer slot 60 on which the substrate is placed may be disposed in the buffer chamber 40. In example embodiments, a plurality of buffer slots 60 may be provided in the buffer chamber 40, and thus a plurality of substrates may be placed in the buffer chamber 40.

The transfer chamber 45 may transfer the substrate between the buffer chamber 40 and the process chamber 50. The transfer chamber 45 may include a transfer robot 65 and a transfer rail 70. The transfer robot 65 may move the transfer rail 70 and may transfer the substrate between the buffer chamber 40 and the process chamber 50. For example, the transfer robot 65 may transfer the substrate(s) placed on the buffer slot 60 into the process chamber 50 while moving on the transfer rail 70.

In example embodiments, the apparatus for processing a substrate may include a plurality of process chambers 50. In the process chambers 50, the predetermined processes including, but not limited to, the deposition process, the etching process, the sputtering process, the coating process, the developing process, the cleaning process, and the drying process on the substrate. Accordingly, the plurality of process chambers 50 may include, but not limited to, an etching chamber, a deposition chamber, a sputtering chamber, a coating chamber, a developing chamber, a cleaning chamber and a drying chamber. In this case, each of the process chambers 50 may have a door which can be opened and closed for loading and unloading the substrate.

Figure 2:
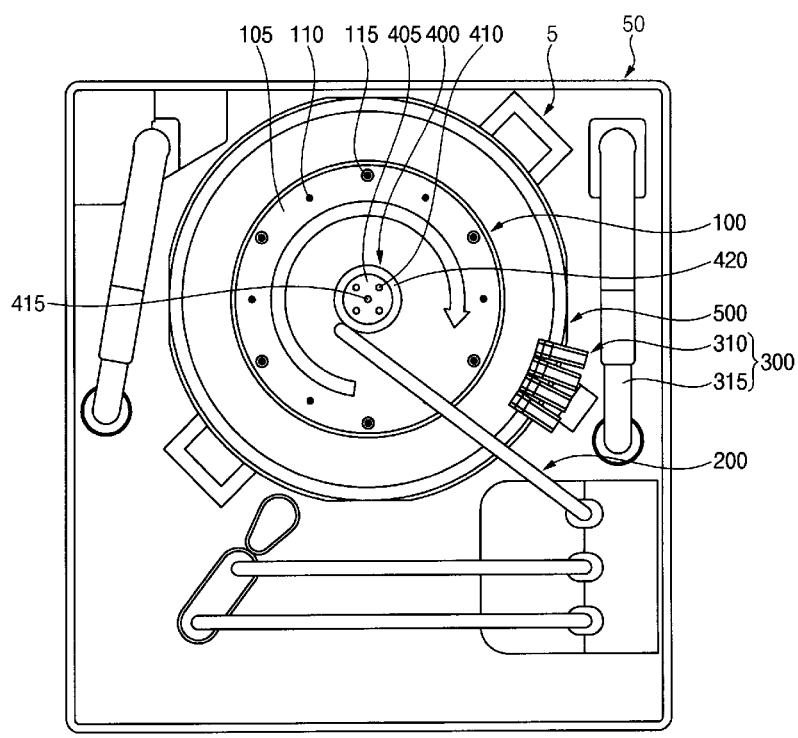
FIG. 2 is a plan view illustrating a process chamber of the apparatus for processing a substrate in accordance with example embodiments of the invention.
Figure 3:
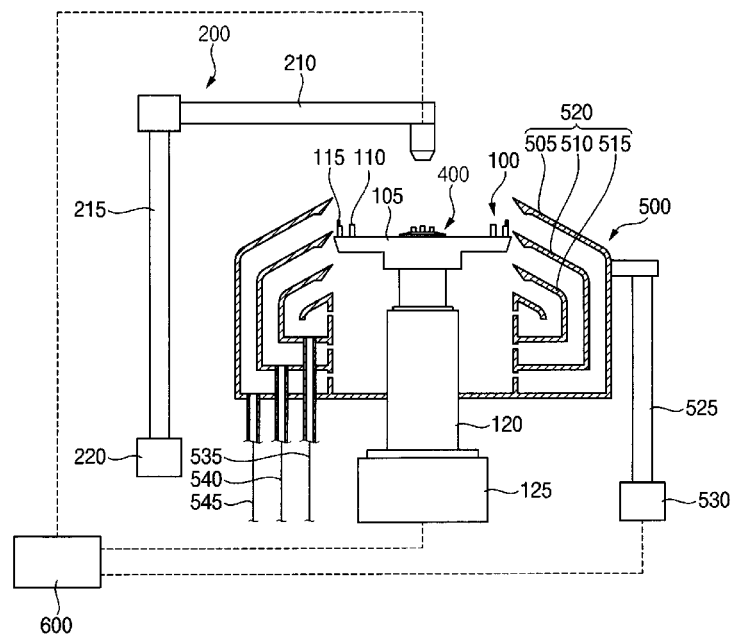
FIG. 3 is a cross sectional view illustrating the process chamber of the apparatus for processing a substrate in accordance with example embodiments of the invention.

FIG. 2 is a plan view illustrating a process chamber of the apparatus for processing a substrate in accordance with example embodiments of the invention. FIG. 3 is a cross sectional view illustrating the process chamber of the apparatus for processing a substrate in accordance with example embodiments of the invention.

Referring to FIGS. 2 and 3, a process chamber 50 of an apparatus for processing a substrate may include a supporting unit 100, a liquid supply unit 200, a gas supply unit 300, a back nozzle unit 400, a collecting unit 500, a control unit 600, etc. Here, the process chamber 50 may include a cleaning chamber or a drying chamber.

A substrate may be placed on the supporting unit 100 disposed in a processing space of the process chamber 50. The supporting unit 100 may rotate the substrate while performing desired processes on the substrate. The supporting unit 100 may include a spin chuck 105, a supporting pin 110, a chuck pin 115, a rotating shaft 120, a first driving member 125, etc.

The spin chuck 105 may have a substantially circular plate shape, however, the shape and dimensions of the spin chuck 105 may vary in accordance with the shape and dimensions of the substrate. The spin chuck 105 may include the supporting pin 110 and the chuck pin 115. In example embodiments, the spin chuck 105 may include a plurality of supporting pins 110 and a plurality of chuck pins 115 for enhancing the stability of the substrate. In this case, the plurality of supporting pins 110 may contact a bottom face of the substrate and the plurality of chuck pins 115 may contact a side face of the substrate. When the desired processes are performed on the substrate in the process chamber 50, the supporting pins 110 may support the substrate and the chuck pins 115 may hold the substrate in its position.

As illustrated in FIG. 3, the rotating shaft 120 may be connected to a lower portion of the spin chuck 105 and the first driving member 125 may be coupled to the rotating shaft 120. The first driving member 125 may rotate the rotating shaft 120 to thereby rotate the spin chuck 105 and the substrate placed on the spin chuck 105.

The liquid supply unit 200 may provide a predetermined liquid onto the substrate in accordance with the processes performed on the substrate. For example, the predetermined liquid may include, but not limited to, a chemical liquid, an organic solvent, deionized water, a cleaning solution, a rinsing solution, etc. The liquid supply unit 200 may include a nozzle 205, a nozzle arm 210, a first moving shaft 215, a second driving member 220, etc.

The nozzle 205 of the liquid supply unit 200 may provide the predetermined liquid onto the substrate placed on the spin chuck 105. For example, the predetermined liquid may be sprayed onto the substrate while rotating the substrate on the spin shuck 105. In example embodiments, the liquid supply unit 200 may include a plurality of nozzles 205 which may be substantially disposed over a central portion of the substrate. In this case, the plurality of nozzles 205 may be disposed at one end portion of the nozzle arm 210 and the other end portion of the nozzle arm 210 may be coupled to the first moving shaft 215. The second driving member 220 may upwardly and downwardly move the first moving shaft 215 and may simultaneously rotate the first moving shaft 215. Therefore, the position of the nozzles 205 located over the substrate may be properly adjusted.

As illustrated in FIG. 2, the gas supply unit 300 may provide a predetermined gas onto the substrate. For example, the gas supply unit 300 may supply an inactive gas such as a nitrogen ($N_2$) gas onto the substrate. The gas supply unit 300 may include a first gas supply member 310 and a second gas supply member 315.

The first gas supply member 310 may be fixed over one end portion of the spin chuck 105 and may provide the gas onto the substrate located on the spin chuck 105. The second gas supply member 315 may move toward the central portion of the substrate and may provide the gas onto the substrate placed on the spin chuck 105.

Figure 4:
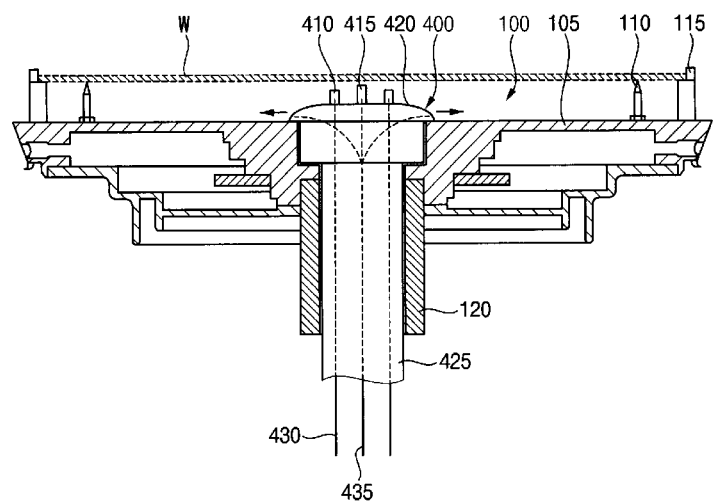
FIG. 4 is a cross sectional view illustrating a back nozzle unit in accordance with example embodiments of the invention.

FIG. 4 is a cross sectional view illustrating a back nozzle unit in accordance with example embodiments of the invention.

Referring to FIG. 2 to FIG. 4, the back nozzle unit 400 the back nozzle unit 400 may include a supporting shaft 425, a back nozzle 510, a gas nozzle 415, a skirt 420, etc. In example embodiments, the back nozzle 400 may perform the cleaning process or the drying process on a substrate W. For example, the back nozzle 400 may serve to clean the bottom face of the substrate W or to dry the bottom face of the substrate W.

The supporting shaft 425 of the back nozzle unit 400 may be inserted into a shaft hole formed at a central portion of the spin chuck 110 of the supporting unit 100. The supporting shaft 410 may not contact the spin chuck 110 so that the supporting shaft 410 may not rotate while the spin chuck 110 rotates.

In example embodiments, the back nozzle unit 400 may include a plurality of back nozzles 410. Each of the plurality of back nozzles 410 may spray the cleaning solution onto the bottom face of the substrate W. For example, the cleaning solution may include the chemical liquid or the deionized water. In example embodiments, some of the plurality of back nozzles 410 may spray the deionized water onto the bottom face of the substrate W and others of the plurality of back nozzles 410 may provide the chemical liquid onto the bottom face of the substrate W. Alternatively, all of the plurality of back nozzles 410 may selectively spray the chemical liquid or the deionized water onto the bottom face of the substrate W. The plurality of back nozzles 410 may be connected to a back nozzle line 430 passing through the supporting shaft 425.

The back nozzle unit 400 may include at least one gas nozzle 415. The at least one gas nozzle 415 may be connected to a gas supply line 435 and may spray a gas onto the bottom face of the substrate W. For example, the at least one gas nozzle 415 may provide the gas in a direction substantially perpendicular to the bottom face of the substrate W. In this case, the gas may include the inactive gas such as the nitrogen ($N_2$) gas. In example embodiments, the at least one gas nozzle 415 may remove the remaining cleaning solution on the bottom face of the substrate W. Alternatively, the at least one gas nozzle 415 may be used in the drying process after performing the cleaning process on the substrate W.

In example embodiments, the back nozzles 410 and the gas nozzle 415 may pass through the skirt 420 and then may protrude from a surface of the skirt 420 toward the bottom face of the substrate W. In particular, the gas nozzle 415 may pass through a central portion of the skirt 420 and the back nozzles 410 may pass through portions of the skirt 420 adjacent to the central portion of the skirt 420. Here, the gas nozzle 415 may have a height substantially greater than heights of the back nozzles 410. In other words, the gas nozzle 415 may be closer the bottom face of the substrate W than the back nozzles 410. Therefore, the cleaning solution may not flow into the gas nozzle 415 while spraying the cleaning solution from the back nozzles 410 onto the bottom face of the substrate W.

Figure 5:
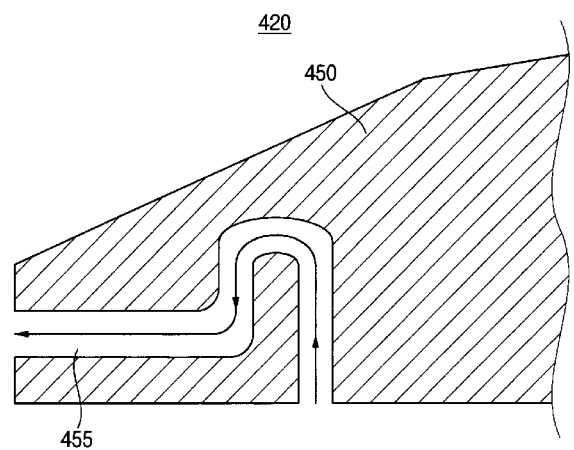
FIG. 5 is a partially enlarged cross sectional view illustrating a skirt of the back nozzle unit in accordance with example embodiments of the invention.

FIG. 5 is a partially enlarged cross sectional view illustrating a skirt of the back nozzle unit in accordance with example embodiments of the invention.

Referring to FIG. 4 and FIG. 5, the skirt 420 may be coupled to the supporting shaft 425. The skirt 420 may have a generally rounded surface structure so that the cleaning solution provided onto the bottom face of the substrate W may flow along the surface of the skirt 420.

In example embodiments, the skirt 420 may include a body 450 and a plurality of flow paths 455 formed in the body 450. For example, the skirt 420 may include two, four, six or eight flow paths 455 disposed along a perimeter of the skirt 420 by constant intervals. As illustrated in FIG. 4, the plurality of flow paths 455 and the gas nozzle 415 may be connected to the gas supply line 435. As shown by the arrows, the plurality of flow paths 455 may provide the gas along a direction substantially parallel to the bottom face of the substrate W while the cleaning solution is provided on the bottom face of the substrate W and/or after the cleaning solution is provided onto the bottom face of the substrate W. Here, the gas supplied from the plurality of flow paths 455 may be identical to the gas supplied from the gas nozzle 415. Additionally, the flow paths 455 may provide again the cleaning solution flowing onto the surface of the body 450 of the skirt 420 after the cleaning solution is provided from the back nozzles 410 onto the bottom face of the substrate W. Therefore, the cleaning effect of the substrate W may be considerably enhanced by the flow paths 455. In other words, after the cleaning solution is provided onto the bottom face of the substrate W from the back nozzles 410, the plurality of flow paths 455 may provide again the cleaning solution flowing on the body 450 of the skirt 420 in the direction substantially parallel to the bottom face of the substrate W and in a direction inclined relative to the bottom face of the substrate W by a predetermined angle of inclination, so the efficiency of the cleaning process to the substrate W may be considerably enhanced. Moreover, when the drying process is performed on the substrate in the process chamber 50, the plurality of flow paths 455 and the gas nozzle 415 of the skirt 420 may provide the gas onto the bottom face of the substrate W in various directions including the direction substantially perpendicular to the bottom face of the substrate W, the direction substantially parallel to the bottom face of the substrate W and the direction inclined to the bottom face of the substrate W by the predetermined angle of inclination, so the efficiency of the drying process performed on the substrate W may be significantly enhanced.

In example embodiments, the plurality of flow paths 455 may prevent the cleaning solution from flowing into the skirt 420 while the cleaning solution is provided from the back nozzles 410 onto the bottom face of the substrate W and/or before the gas is provided from the plurality of flow paths 455 onto the bottom face of the substrate W. To this end, each of the plurality of flow paths 455 may be formed upwardly in the body 450, may be bent downwardly in the body 450, and then may be extended in the direction substantially parallel to the bottom face of the substrate W (that is, a direction substantially parallel to the spin chuck 105). As such, the plurality of flow paths 455 may effectively prevent the inflow of the cleaning solution into the body 450 of the skirt 420 so that the cleaning solution may not flow into the skirt 420 while performing the cleaning process on the substrate W.

Figure 6:
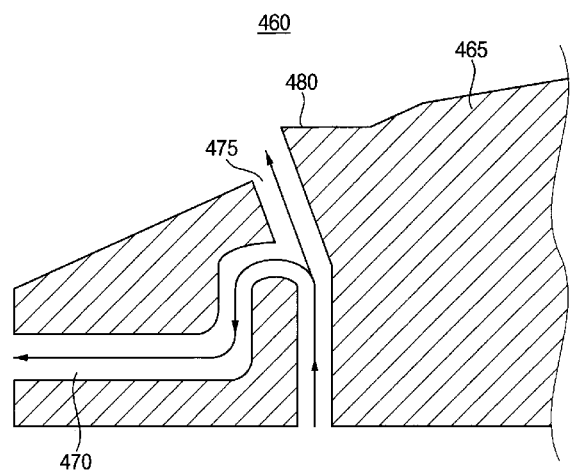
FIG. 6 is a partially enlarged cross sectional view illustrating a skirt of the back nozzle unit in accordance with some example embodiments of the invention.

FIG. 6 is a partially enlarged cross sectional view illustrating a skirt of the back nozzle unit in accordance with some example embodiments of the invention.

Referring to FIG. 4 and FIG. 6, a skirt 460 according to some example embodiments may include a body 465, and a plurality of first flow paths 470 and a plurality of second flow paths 475 which may be formed in the body 450. In some example embodiments, the skirt 460 may have two, four, six or eight first flow paths 470 disposed along a circumference of the skirt 460 by constant intervals, and may additionally have two, four, six or eight second flow paths 475 divided from the first flow paths 470, respectively. The number of the first and the second flow paths 470 and 475 may vary in accordance with the structure and dimensions of the back nozzle 400 and/or the structure and dimensions of the process chamber 50. The plurality of first flow paths 470 and the plurality of second flow paths 475 may provide the gas onto the bottom face of the substrate W.

As illustrated in FIG. 6, the first flow paths 470 may be formed upwardly in the body 450, may be bent downwardly in the body 450, and then may be extended in the direction substantially parallel to the bottom face of the substrate W. Each of the second flow paths 475 may be respectively extended from portions of the first flow paths 470 formed upwardly in the body 450 by a predetermined angle of inclination relative to the direction substantially perpendicular to the bottom face of the substrate W. For example, the second flow paths 475 may be extended from the first flow paths 470 by an angle of inclination that is greater than about 0 degree and equal to or smaller than about 90 degrees.

In some example embodiments, the skirt 460 may include a plurality of guide members 480 disposed at end portions of the plurality of second flow paths 475, respectively. In this case, the plurality of guide members 480 may be integrally formed with the body 465. For example, the guide members 480 may protrude from the body 450 by an angle of inclination of greater than about 0 degree and equal to or smaller than about 90 degrees with respect to the direction substantially perpendicular to the bottom face of the substrate W. The plurality of guide members 480 may enable the gas to be exactly sprayed from the second flow paths 475 along a desired direction, and thus the cleaning effect and the drying effect of the substrate W may be more considerably enhanced. Further, the guide members 480 may protrude from the body 465 such that the inflow of the cleaning solution into the skirt 460 through the second flow paths 475 may be effectively prevented.

Figure 7:
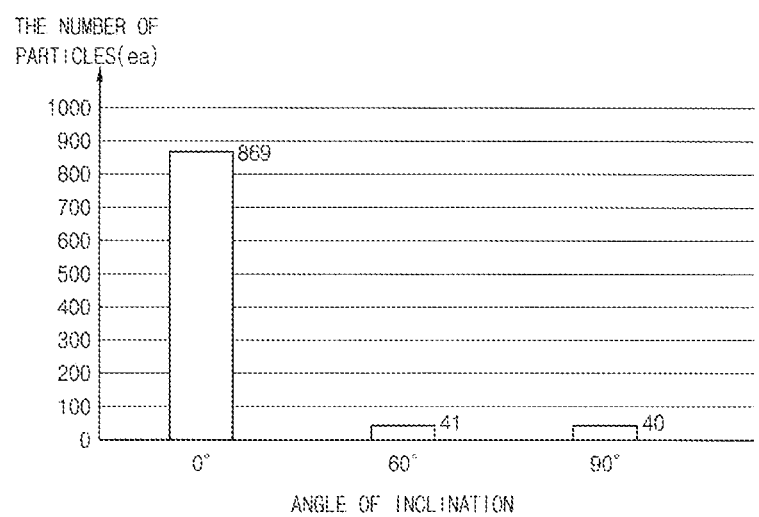
FIG. 7 is a graph showing the removal efficiency of particles in a chamber using the skirt of the back nozzle unit in accordance with some example embodiments of the invention.

FIG. 7 is a graph showing the removal efficiency of particles in a chamber using the skirt of the back nozzle unit in accordance with some example embodiments of the invention. In FIG. 7, the horizontal axis represents the angle of inclination of the second flow paths of the skirt relative to the bottom face of the substrate and the vertical axis indicates the number of particles remaining on the bottom face of the substrate.

As seen from FIG. 7, when the bottom face of the substrate is cleaned using the skirt including the plurality of first flow paths and the plurality of second flow paths, the cleaning effect of the substrate varies in accordance with the angle of inclination of the second flow paths of the skirt. Substantially, the cleaning efficiency of the substrate is considerably enhanced when the second flow paths of the skirt have the angle of inclination of about 60 degrees and about 90 degrees.

Referring to FIG. 2 and FIG. 3 again, the collecting unit 500 may include a connecting container 520, a second moving shaft 525, a third driving member 530, etc. The collecting unit 500 may collect the liquid provided onto the substrate. The supporting unit 100 may rotate the substrate while the liquid is supplied from the liquid supply unit 200 onto the substrate such that the liquid may be substantially uniformly provided onto the entire surface of the substrate. In this case, droplets of the liquid may be dispersed toward the outside by mean of the centrifugal force generated by the rotation of the substrate. The collecting unit 500 may retrieve the dispersed droplets of the liquid.

The collecting container 520 may surround the spin chuck 105 and may have an opened upper portion. For example, the collecting container 520 may have a cylindrical shape. The collecting container 520 may include a plurality of collecting cups. In example embodiments, the collecting container 520 may include a first collecting cup 505, a second collecting cup 510 and a third collecting cup 515. Here, the first to the third collecting cups 505, 510 and 515 may be disposed in a multiple configuration for retrieving different compositions of liquids. For example, the first collecting cup 505 may be disposed at a position substantially higher than the second collecting cup 510 and the second collecting cup 510 may be disposed at a position substantially higher than the third collecting cup 515. The first collecting cup 505, the second collecting cup 515 and the third collecting cup 515 may be connected to a first retrieving line 535, a second retrieving line 540 and a third retrieving line 545, respectively. The liquid retrieved through the first to the third retrieving lines 535, 540 and 545 may be reused by a regenerative apparatus (not shown).

As illustrated in FIG. 3, the second moving shaft 525 may move upwardly and downwardly by the third driving member 530 so that the first to the third collecting cups 505, 510 and 515 may move over and under the spin chuck 105. In this case, the second moving shaft 525 and the third driving member 530 may separately move the first to the third collecting cups 505, 510 and 515 over and under the spin chuck 105.

The control unit 600 may control the operations of the supporting unit 100, the liquid supply unit 200, the gas supply unit 300, the back nozzle unit 400 and the collecting unit 500 in accordance with the processes performed on the substrate. For example, the control unit 600 may adjust the rotation speed of the spin chuck 105, the spraying of the nozzle 205, the operation of the back nozzle 400, the movements of the first to the third collecting cups 505, 510, and 515, etc.

According to example embodiments of the invention, a back nozzle unit of an apparatus for processing a substrate may include a skirt having a plurality of flow paths capable of providing a gas in a direction substantially parallel to a bottom face of a substrate and in a direction inclined to the bottom face of the substrate by a predetermined angle of inclination. A cleaning liquid may be effectively provided onto a bottom face of the substrate using the back nozzle unit so that the efficiency of cleaning process performed on the substrate may be considerably enhanced. Further, the plurality of flow paths of the skirt may provide the gas toward the bottom face of the substrate along various directions such that the efficiency of drying process executed on the substrate may be significantly enhanced. Therefore, an integrated circuit device including a semiconductor device or a display device including a flat panel display device manufactured using the apparatus for processing a substrate may have improved performance and enhanced reliability.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A back nozzle unit comprising:
   a skirt disposed under a bottom face of a substrate;
   at least one back nozzle protruding from the skirt and providing a cleaning solution onto the bottom face of the substrate; and
   a gas supply nozzle protruding from the skirt and providing a gas onto the bottom face of the substrate,
   wherein the skirt includes a body and a plurality of flow paths being formed in the body and providing a gas toward the bottom face of the substrate.

2. The back nozzle unit of claim 1, wherein the gas nozzle provides the gas in a direction perpendicular to the bottom face of the substrate, and the plurality of flow paths provide the gas in a direction parallel to the bottom face of the substrate and in a direction inclined relative to the bottom face of the substrate by a predetermined angle of inclination.

3. The back nozzle unit of claim 1, wherein the skirt includes a plurality of first flow paths providing the gas in the direction parallel to the bottom face of the substrate.

4. The back nozzle unit of claim 3, wherein the plurality of first flow paths are disposed along a perimeter of the skirt by constant intervals.

5. The back nozzle unit of claim 3, wherein each of the plurality of first flow paths prevents the cleaning solution from flowing into the body.

6. The back nozzle unit of claim 4, wherein each of the plurality of first flow paths is formed upwardly in the body, is bent downwardly in the body and then is extended in a direction parallel to the bottom face of the substrate.

7. The back nozzle unit of claim 3, wherein the skirt further includes a plurality of second flow paths providing the gas onto the bottom face of the substrate by a predetermined angle of inclination.

8. The back nozzle unit of claim 7, wherein the gas provided from the plurality of first flow paths and the plurality of second flow paths provides again the cleaning solution flowing along the body toward the bottom face of the substrate.

9. The back nozzle unit of claim 7, wherein the plurality of second flow paths are divided from the plurality of first flow paths, respectively, and extend upwardly in the body.

10. The back nozzle unit of claim 7, wherein the predetermined angle of inclination is greater than about 0 degree and equal to or smaller than about 90 degrees with respect to the direction perpendicular to the bottom face of the substrate.

11. The back nozzle unit of claim 8, wherein the skirt further includes a plurality of guide members adjacent to the plurality of second flow paths, respectively and the plurality of guide members guide the gad the gas toward the bottom face of the substrate.

12. The back nozzle unit of claim 11, wherein each of the plurality of guide members protrudes from the body by an angle of greater than about 0 degree and equal to or smaller than about 90 degrees with respect to the direction perpendicular to the bottom face of the substrate.

13. A process chamber comprising:
    a supporting unit on which a substrate is placed; and a back nozzle unit disposed under a bottom face of the substrate, wherein the back nozzle unit includes a skirt, at least one back nozzle providing a cleaning solution onto the bottom face of the substrate and a gas nozzle providing a gas onto the bottom face of the substrate, and wherein the skirt includes a body and a plurality of flow paths being formed in the body and providing a gas toward the bottom face of the substrate.

14. The process chamber of claim 13, wherein the gas nozzle provides the gas in a direction perpendicular to the bottom face of the substrate and the plurality of flow paths provide the gas in a direction parallel to the bottom face of the substrate and in a direction inclined relative to the bottom face of the substrate.

15. The process chamber of claim 13, wherein the skirt includes a plurality of first flow paths providing the gas in the direction parallel to the bottom face of the substrate and a plurality of second flow paths providing the gas in the direction inclined relative to the bottom face of the substrate by a predetermined angle of inclination.

16. The process chamber of claim 15, wherein the predetermined angle of inclination is greater than about 0 degree and equal to or smaller than about 90 degrees with respect to a direction perpendicular to the bottom face of the substrate.

17. An apparatus for processing a substrate comprising:

a processing module including at least one process chamber performing a desired process on a substrate; and an index module transferring the substrate from an outside into the processing module, the at least one process chamber including:

a supporting unit on which the substrate is placed; and a back nozzle unit disposed under a bottom face of the substrate, wherein the back nozzle unit includes a skirt, at least one back nozzle providing a cleaning solution onto the bottom face of the substrate and a gas nozzle providing a gas onto the bottom face of the substrate, and the skirt includes a body and a plurality of first flow paths and a plurality of second flow paths which are formed in the body and provide a gas toward the bottom face of the substrate.

18. The apparatus for processing a substrate of claim 17, wherein the plurality of first flow paths provide the gas in a direction parallel to the bottom face of the substrate and the plurality of second flow paths provide the gas with an angle of inclination of greater than about 0 degree and equal to or smaller than about 90 degrees relative to the bottom face of the substrate.

* * * * *